United States Patent
Dhindsa et al.

(10) Patent No.: US 8,043,430 B2
(45) Date of Patent: Oct. 25, 2011

(54) METHODS AND APPARATUSES FOR CONTROLLING GAS FLOW CONDUCTANCE IN A CAPACITIVELY-COUPLED PLASMA PROCESSING CHAMBER

(75) Inventors: Rajinder Dhindsa, San Jose, CA (US); Jerrel K. Antolik, Livermore, CA (US); Scott Stevenot, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1293 days.

(21) Appl. No.: 11/641,670

(22) Filed: Dec. 20, 2006

(65) Prior Publication Data

US 2008/0149596 A1 Jun. 26, 2008

(51) Int. Cl.
*C23C 16/505* (2006.01)

(52) U.S. Cl. ............... 118/715; 118/692; 118/723 R; 156/345.26; 156/345.33; 216/67; 427/569

(58) Field of Classification Search ............ 118/715, 118/692, 723 R; 156/345.26, 345.33; 216/67; 427/569
See application file for complete search history.

(56) References Cited

U.S. PATENT DOCUMENTS

| | | | |
|---|---|---|---|
| 5,820,723 A | 10/1998 | Benjamin et al. | |
| 6,051,100 A | 4/2000 | Walko, II | |
| 6,129,808 A | 10/2000 | Wicker et al. | |
| 6,176,969 B1 | 1/2001 | Park et al. | |
| 6,206,976 B1 * | 3/2001 | Crevasse et al. | 118/720 |
| 6,261,408 B1 * | 7/2001 | Schneider et al. | 156/345.26 |
| 6,362,110 B1 | 3/2002 | Marks | |
| 6,408,786 B1 | 6/2002 | Kennedy et al. | |
| 6,433,484 B1 * | 8/2002 | Hao et al. | 315/111.21 |
| 6,561,480 B1 * | 5/2003 | Komiya et al. | 251/129.12 |
| 6,744,212 B2 | 6/2004 | Fischer et al. | |
| 6,823,815 B2 * | 11/2004 | Han et al. | 118/723 E |
| 6,932,111 B2 | 8/2005 | Ishigaki | |
| 7,255,773 B2 | 8/2007 | Ogasawara et al. | |
| 2001/0014540 A1 * | 8/2001 | Shan et al. | 438/710 |
| 2003/0010447 A1 | 1/2003 | Tzu | |
| 2004/0206309 A1 | 10/2004 | Bera et al. | |
| 2005/0241763 A1 | 11/2005 | Huang et al. | |
| 2005/0263070 A1 | 12/2005 | Fink | |
| 2006/0244304 A1 * | 11/2006 | Steinke et al. | 301/64.701 |

FOREIGN PATENT DOCUMENTS

| | | | |
|---|---|---|---|
| JP | 09-178000 | * | 7/1997 |
| KR | 10-2002-0004623 | * | 1/2002 |

(Continued)

OTHER PUBLICATIONS

Search Report and Written Opinion mailed Nov. 19, 2009 in corresponding Singapore Patent Appln. No. 200904124-5.

(Continued)

*Primary Examiner* — Ram Kackar
*Assistant Examiner* — Satish Chandra
(74) *Attorney, Agent, or Firm* — Buchanan Ingersoll & Rooney PC (57) ABSTRACT

Apparatuses are provided for controlling flow conductance of plasma formed in a plasma processing apparatus that includes an upper electrode opposite a lower electrode to form a gap therebetween. The lower electrode is adapted to support a substrate and coupled to a RF power supply. Process gas injected into the gap is excited into the plasma state during operation. The apparatus includes a ground ring that concentrically surrounds the lower electrode and has a set of slots formed therein, and a mechanism for controlling gas flow through the slots.

12 Claims, 9 Drawing Sheets

FOREIGN PATENT DOCUMENTS

KR    1020020004623 A    1/2002

OTHER PUBLICATIONS

Search and Examination Report mailed Nov. 19, 2010 for Singapore Appln. No. 200904124-5.

International Search Report and Written Opinion dated Jun. 18, 2008 for PCT/US2007/025831.

SG Search and Examination Report dated May 20, 2010 for Singapore Appln. No. 200904124-5.

* cited by examiner

METHODS AND APPARATUSES FOR CONTROLLING GAS FLOW CONDUCTANCE IN A CAPACITIVELY-COUPLED PLASMA PROCESSING CHAMBER

BACKGROUND

Integrated circuits are formed from a wafer or substrate over which are formed patterned microelectronics layers. In the processing of the substrate, plasma is often employed to deposit films on the substrate or to etch intended portions of the films. Shrinking feature sizes and implementation of new materials in next generation microelectronics layers have put new requirements on plasma processing equipments. The smaller features, larger substrate size and new processing techniques, such as dual damascene etching technique, require precise control of the plasma parameters, such as plasma density and uniformity across the substrate, for better yields.

SUMMARY

An embodiment of an apparatus for controlling gas flow conductance in a plasma processing chamber including an upper electrode disposed opposite a lower electrode adapted to support a substrate is provided, which comprises a ground ring configured to concentrically surround the lower electrode, the ground ring including a first set of slots formed therein; a bypass choke ring; a cover ring disposed over the ground ring and bypass choke ring, the cover ring including a second set of slots formed therein; and a mechanism adapted to move the bypass choke ring relative to the ground ring to control gas flow conductance through the first and second sets of slots between (i) an ON state in which the first set of slots is in fluid communication with the second set of slots such that gas can flow through the first and second sets of slots and (ii) an OFF state in which the first set of slots is blocked by the bypass choke ring such that gas cannot flow through the first and second sets of slots.

Another apparatus for controlling gas flow conductance in a plasma processing chamber including an upper electrode disposed opposite a lower electrode adapted to support a substrate is provided, which comprises a stationary ground ring configured to concentrically surround the lower electrode, the ground ring including a first set of slots formed therein; a stationary cover ring including a second set of slots formed therein; a bypass choke ring disposed between the ground ring and the cover ring, the bypass choke ring including a third set of slots formed therein; and a mechanism adapted to rotate the bypass choke ring relative to the ground ring to vary an amount of overlap between the first and third sets of slots to thereby control gas flow conductance through the first, second, and third sets of slots between (i) an ON state in which the first set of slots is in fluid communication with the third set of slots such that gas can flow through the first, second and third sets of slots and (ii) an OFF state in which the first set of slots is blocked by the bypass choke ring such that gas cannot flow through the first, second and third sets of slots.

Another embodiment of an apparatus for controlling gas flow conductance in a plasma processing chamber including an upper electrode disposed opposite a lower electrode adapted to support a substrate is provided, which comprises a stationary ground ring configured to concentrically surround the lower electrode, the ground ring including a first set of slots formed therein; a stationary cover ring disposed on the ground ring, the cover ring including a second set of slots formed therein, each of the second sets of slots is aligned with a corresponding one of first set of slots; a bypass choke ring disposed under the ground ring, the bypass choke ring including protrusions formed thereon, wherein a spacing between each protrusion and an inner surface defining a corresponding first slot determines the gas flow conductance through the first and second sets of slots; and a mechanism adapted to move the choke ring relative to the ground ring to adjust the spacing to vary gas flow conductance through the first and second sets of slots between (i) an ON state in which the first set of slots is in fluid communication with the second set of slots such that gas can flow through the first and second sets of slots and (ii) an OFF state in which the first set of slots is blocked by the bypass choke ring such that gas cannot flow through the first and second sets of slots.

DETAILED DESCRIPTION

Figure 1:
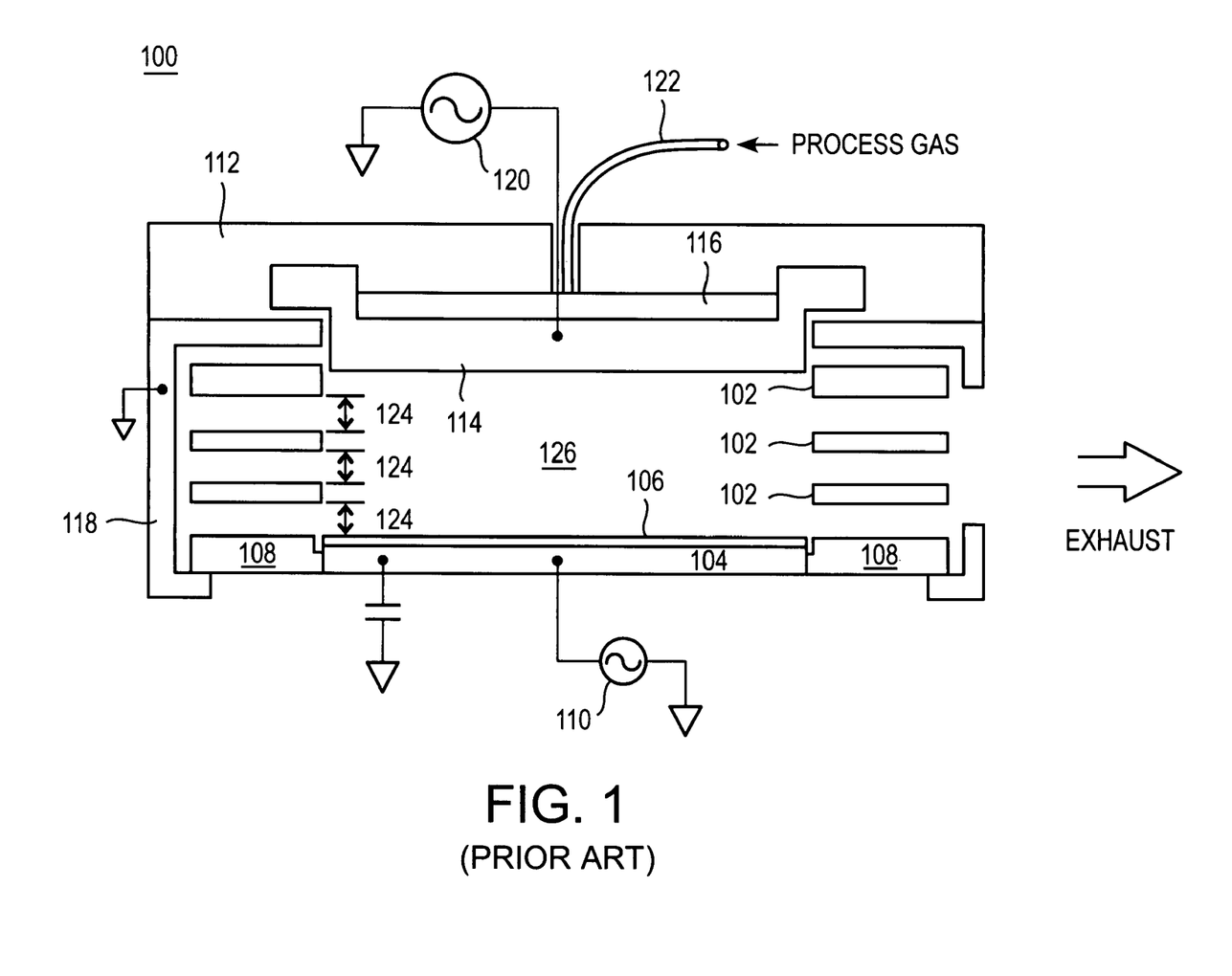
FIG. 1 shows a schematic diagram of a CCP reactor chamber.

In a capacitively-coupled RF plasma (CCP) reactor or chamber, plasma is generated in the gap between two opposite upper and lower electrodes. FIG. 1 shows an embodiment of a CCP reactor chamber 100 for processing a substrate. As depicted, a lower electrode assembly includes a focus ring 108, and a chuck 104 for holding a substrate 106 in place during operation of the chamber. The chuck 104 can be an electrostatic chuck, for instance, and is supplied with radio frequency (RF) power by an RF power supply 110. An upper electrode assembly includes an upper electrode 114 and a baffle or showerhead 116. The upper electrode 114 can be grounded or powered by another RF power supply 120 during operation. Gas flow is supplied via a conduit 122 and passes through the baffle 116. The gas is electrically excited into plasma in the gap 126. The plasma is confined by confinement rings 102a, 102b, 102c.

Gas passes through the spacing/gaps 124 between the rings 102 and is exhausted from the chamber through a wall 118 by a vacuum pump. The plasma characteristics are affected by the gas flow rate passing through the gaps 124. The overall gas flow conductance of the flow path from the baffle 116 to the exhaust depends on several factors including the number of rings and size of the gaps between the rings. In an embodiment, the gaps 124 are adjustable and controlled by a gap control mechanism (not shown in FIG. 1).

It has been determined that in some processes for plasma processing of substrates, one or more steps of the process require flow conductance levels that exceed the maximum capacity of the gap control mechanism. In such processes, the substrate may need to be unloaded from the chamber and processed in other chambers in which such flow conductance levels can be achieved. In light of this problem, apparatuses are provided that are operable to provide an expanded, variable gas flow conductance range in a capacitively-coupled plasma (CCP) reactor or chamber. The apparatuses allow the plasma processing chamber to provide a wide range of plasma conditions.

Figure 2:
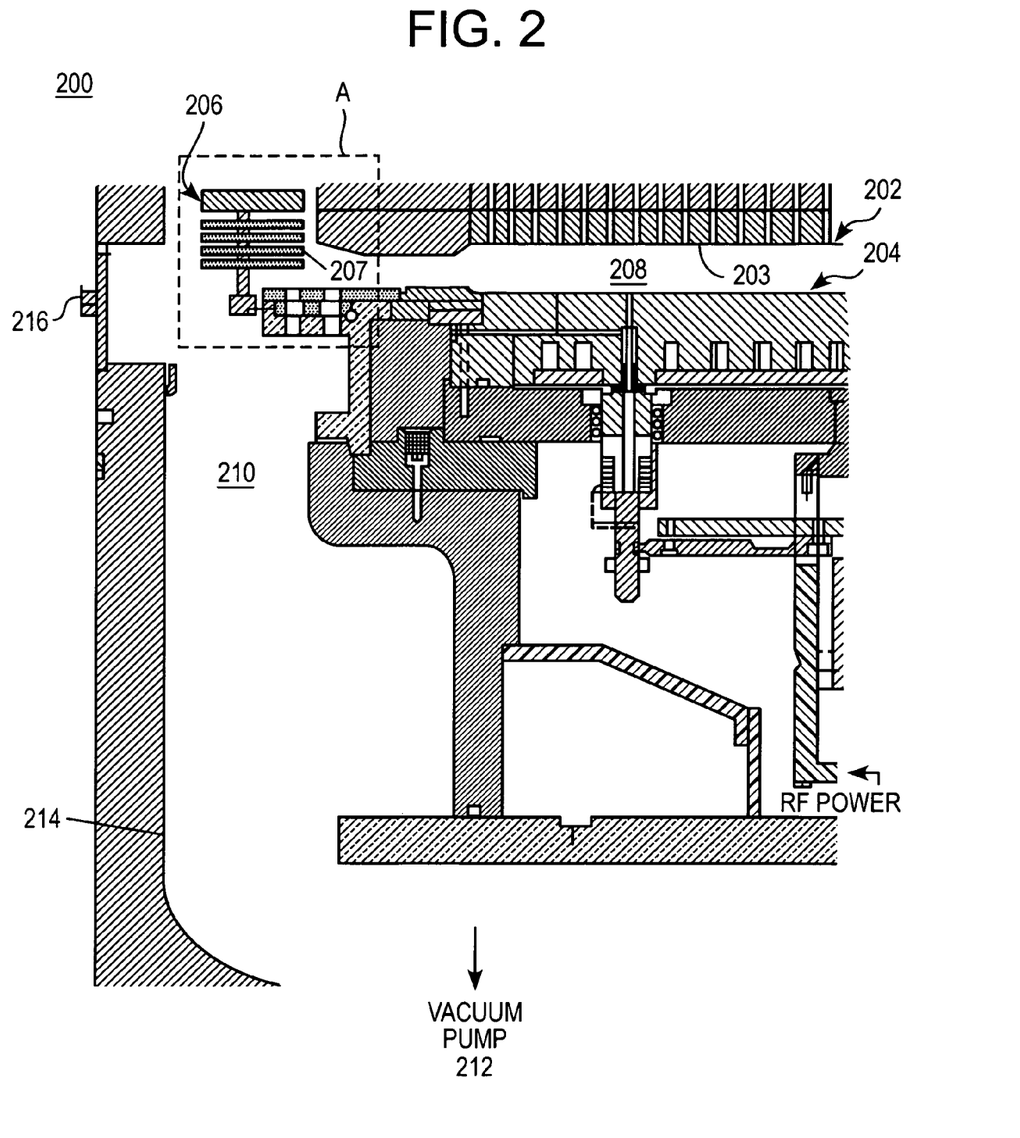
FIG. 2 shows a schematic cross sectional diagram of a CCP chamber in accordance with one embodiment.

FIG. 2 shows an exemplary embodiment of a portion of a capacitively-coupled plasma (CCP) reactor or chamber 200. The chamber 200 is provided with an apparatus that provides an expanded, variable gas flow conductance range in chamber 200. The chamber 200 includes an upper electrode assembly 202 and a lower electrode assembly 204 that holds a substrate in place during plasma processing. The upper and lower electrode assemblies 202, 204 are separated from each other by a space or gap 208. The chamber wall 214 includes a door or gate 216 through which substrates are unloaded/loaded into the chamber 200.

The upper electrode assembly 202 includes a gas distribution member 203, such as a showerhead electrode, through which process gas is supplied into the gap 208. The process gas supplied into the gap 208 is excited into the plasma state by RF power supplied to the lower electrode assembly 204. The plasma in the gap 208 is confined by a wafer area pressure (WAP)/confinement ring assembly 206 that includes a stack of confinement rings 207. The apparatus can include a gap control mechanism for the confinement rings. Neutral gas species in the gap 208 pass through the spacing between the confinement rings 207 in the generally horizontal direction and enter the chamber space 210. Gas is exhausted from the chamber space 210 by a vacuum pump 212 coupled to the wall 214.

The rate of gas flow from the gas distribution member 203 to the chamber space 210 affects the pressure in the gap 208. To increase the gas flow rate, an additional gas flow conductance path or circuit is provided (in parallel) to the path from the gas distribution member 203 through the gaps between the confinement rings 207 to the chamber space 210.

Figure 3A:
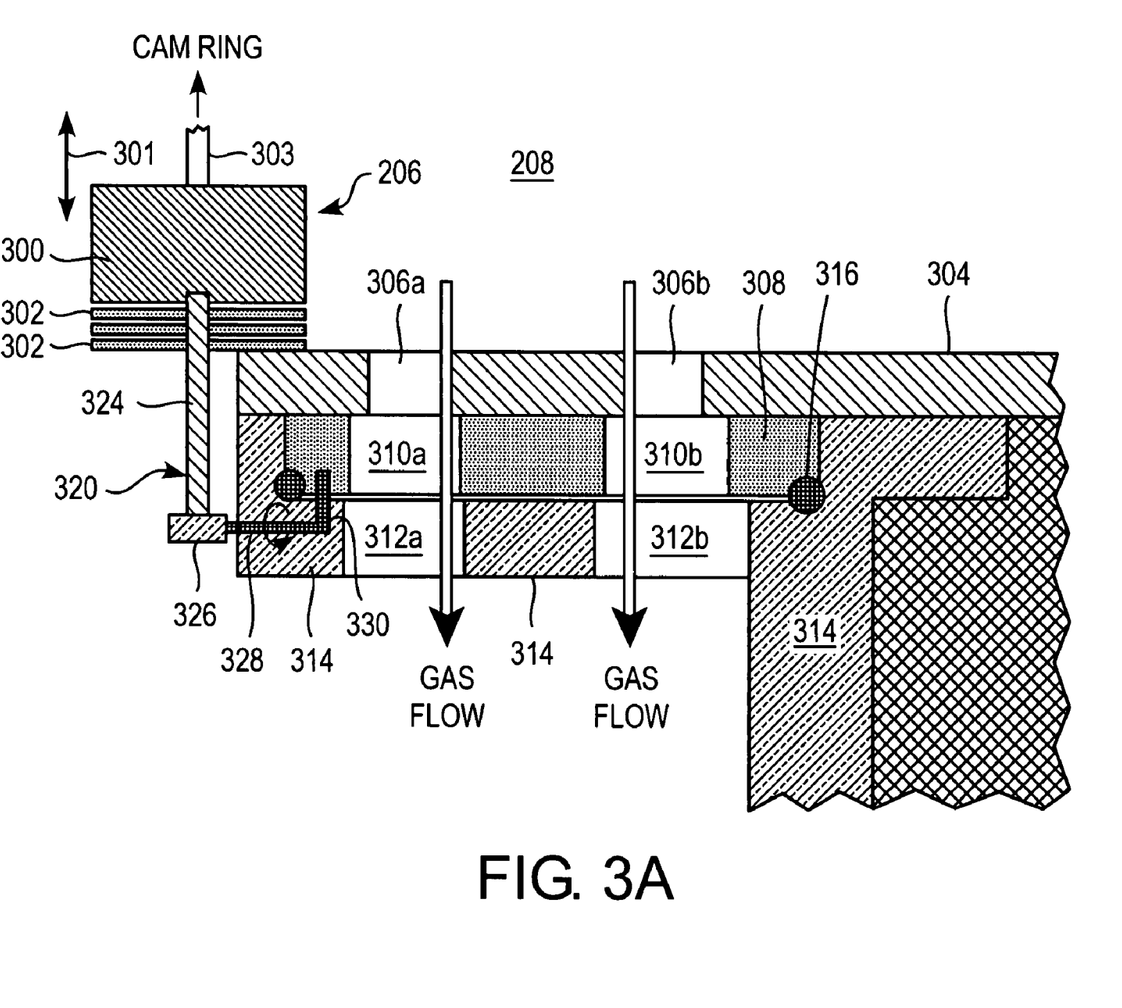
FIG. 3A shows an enlarged view of region A in FIG. 2.
Figures 3B, 3C, 3D, 3E, 3F:
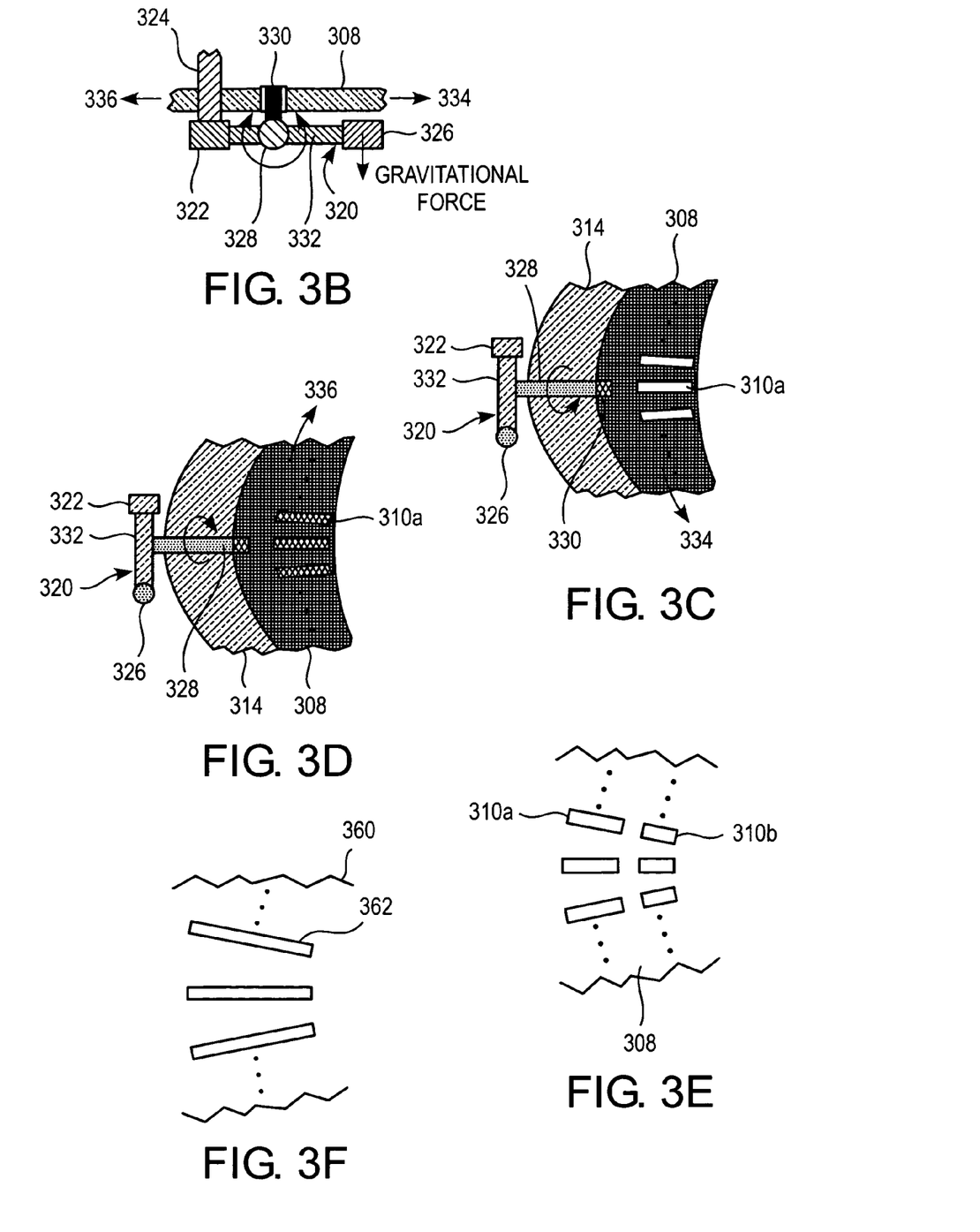
FIGS. 3B-3E show schematic diagrams of an apparatus for controlling gas flow conductance in the structure shown in FIG. 3A.
FIG. 3F shows a schematic diagram of an alternative embodiment of an apparatus for controlling gas flow conductance.

FIG. 3A shows an enlarged view of region A shown in FIG. 2, illustrating a mechanism 320 for controlling the gas flow conductance of bypass slots 312a, 312b (referred to herein collectively as rings 312) in a ground ring 314. FIG. 3B shows a side view of the mechanism 320. FIGS. 3C and 3D show partial cut-away top plan views of the mechanism 320, bypass choke ring 308, and ground ring 314, wherein slotted ground cover ring 304 (FIG. 3A) is removed for the purpose of illustration. As depicted in FIGS. 3A-3D, the lower electrode assembly includes the ground ring 314, bypass choke ring 308 mounted in a ring-shaped channel formed in the ground ring 314, and ground cover ring 304. Multiple balls 316, preferably formed of polytetrafluoroethylene (PTFE) or the like, are used to reduce rotational friction between the ground ring 314 and the choke ring 308 during movement of the choke ring 308. FIG. 3E shows a top plan view of the bypass choke ring 308 that includes multiple slots 310a, 310b (referred to herein collectively as slots 310) extending in the radial direction of the choke ring 308. Likewise, the cover ring 304 and ground ring 314 respectively include slots 306a, 306 b (referred to herein collectively as slots 306) and slots 312a, 312b that are similar to the slots 310. The slots 306, 310 and 312 can have any suitable shape, such as rectangular or trapezoidal. The ground ring 314 is made of conductive material, such as aluminum; the cover ring 304 is made of a dielectric material, such as quartz; and the choke ring 308 is made of a dielectric material, such as quartz or SiC.

The cover ring 304 and ground ring 314 are stationary, while the bypass choke ring 308 can be rotated relative to the cover ring 304 and ground ring 314. The bypass slots 306 and 312 formed in the cover ring 304 and ground ring 314 are aligned with respect to each other when viewed from the top, wherein each pair of slots 306a, 312a; 306b, 312b forms a line of sight path. The control mechanism 320 is operable to rotate the bypass choke ring 308 relative to the stationary cover ring 304 and ground ring 314 to control gas flow through the slots 306, 310, and 312.

The confinement ring assembly (or WAP ring assembly) 206 includes a WAP ring 300 and a stack of confinement rings 302. Hereinafter, the terms "confinement ring" and "WAP ring" are used interchangeably. The confinement ring assembly 206 is moved in the direction of arrow 301 by a suitable actuation mechanism, such as a plunger 303 coupled to a CAM ring. The direction of arrow 301 may be parallel to the axial direction of the three rings, 304, 308, and 314. A more detailed description of the CAM ring is found in commonly-owned U.S. Pat. No. 6,019,060, which is hereby incorporated by reference in its entirety. The confinement ring assembly 206 is coupled to the mechanism 320. The mechanism 320 includes an actuation rod or bar 324, a lever 332 pivoted on the axis of shaft 328, and an elongated arm 330 secured to the shaft 328. The axis of the shaft 328 may be perpendicular to the axial direction of the ground ring 314. A counterweight 326 is provided at one end of the lever 332 and an actuation component 322 is provided at the other end of the lever 332. The actuation component 322 is urged against the lower tip of the actuation rod 324 by the gravitational force acting on the counterweight 326.

When the confinement ring assembly 206 is moved upward, the actuation rod 324 is also moved upward. Then, due to the force of the weight 326, the lever 332 rotates in the clockwise direction (FIG. 3B) and the tip of the arm 330 moves in the direction of arrow 334. Then, the arm 330 rotates the bypass choke ring 308 in the direction 334 so that the bypass slots 310 are aligned with the other slots 312 and 306, such that gas flow passageways are formed through the three sets of slots. FIG. 3C shows the configuration of the mechanism 320 in a fully ON gas flow state. In FIG. 3C, the slotted ground cover ring 304 is removed for the purpose of illustration. Thus, operation of the mechanism 320 provides an additional gas flow conductance path through slots 306, 310, 312.

When the confinement ring assembly 206 moves downward, the actuation rod 324 also pushes the actuation component 322 downward. Then, the lever 332 rotates in the counterclockwise direction and the tip of the arm 330 moves in the direction of arrow 336 (FIG. 3B). Then, the bypass choke ring 308 moves in the direction 336, thereby partially blocking the bypass slots 306 and 312. When the actuation component 322 is at its lowest position, bypass slots 306 and 312 are entirely blocked by the bypass choke ring 308, as depicted in FIG. 3D. FIG. 3D shows the configuration of the mechanism 320 in the OFF gas flow state.

Slots 306, 310, and 312 can have various shapes and sizes that can provide gas flow passages upon alignment with each other. FIG. 3F is a top view of an alternative embodiment of a bypass choke ring 360. As depicted, the choke ring 360 has a row of slots 362 arranged along its circumferential direction. In the embodiment, the cover ring and ground ring can have slot configurations similar to the choke ring 360.

In the embodiments shown in FIGS. 4A-7, for the purpose of illustration, each exemplary cover ring, choke ring, and ground ring is shown to include either one or two rows of slots. However, in other embodiments, each of these three rings can have other suitable numbers of rows and numbers of slots in each row.

Figures 4A, 4B, 4C:
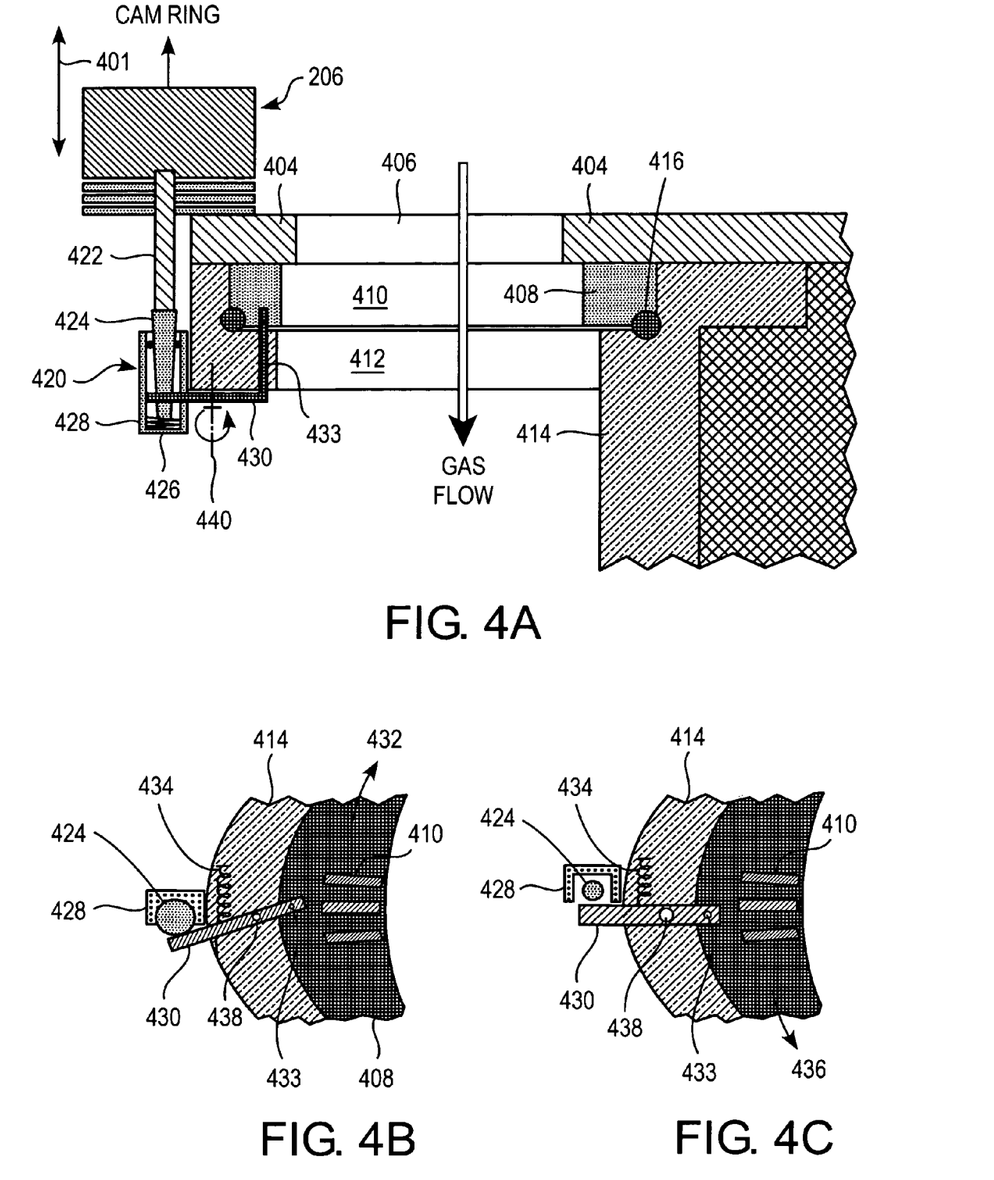
FIGS. 4A-4C show schematic diagrams of another alternative embodiment of an apparatus for controlling gas flow conductance.

FIG. 4A shows an apparatus including a choke ring control mechanism 420 according to another exemplary embodiment. FIGS. 4B and 4C show partial cut-away top plan views of the mechanism 420, the bypass choke ring 408, and ground ring 414. In these figures, slotted ground cover ring 404 (FIG. 4A) is removed for the purpose of illustration. As in the embodiment shown in FIG. 3A, the lower electrode assembly includes a ground ring 414, bypass choke ring 408 mounted in a ring-shaped channel formed in the ground ring 414, and a slotted ground cover ring 404. In the embodiment, the ground ring 414 and the cover ring 404 are stationary, while the choke ring 408 can be rotated relative to the cover ring 404 and ground ring 414. The rings 404, 408, 414 can be made of the same materials as those of the respective rings shown in FIG. 3A, for example. As shown in FIG. 4A, the confinement ring assembly 206 is moved in the direction of arrow 401 by a suitable mechanism, such as CAM ring, and is coupled to the mechanism 420. Multiple balls 416, preferably formed of PTFE or the like, are used to reduce rotational friction between the ground ring 414 and the choke ring 408 during movement of the choke ring 408.

The mechanism 420 includes an actuation rod 422 coupled to the confinement ring assembly 206 and having a tapered section 424; an outer case 428 secured to the ground ring 414; an actuation spring 426 for resiliently urging the actuation rod 422 and confinement ring assembly 206 against the CAM ring; a lever 430 pivoted at a point 438; an arm 433 having one end secured to the lever 430; and a lever spring 434 for resiliently urging the lever 430 against the side surface of the tapered section 424. The side surface of the tapered section 424 is in sliding contact with the lever 430. The spring 426 is optional. The CAM ring assembly 206 can include a spring for resiliently urging the confinement ring assembly 206 against the CAM ring as detailed in U.S. Pat. No. 6,019,060.

In operation, as the actuation rod 422 is moved downward, preferably in the axial direction of the ground ring 414, the side surface of the tapered section 424 pushes the lever 430 sideways, causing the lever 430 to rotate in the counterclockwise direction (when viewed from the top) on axis 440. The axis 440 can be oriented parallel to the axial direction of the ground ring 414. As the lever 430 rotates, the arm 433 and the bypass choke ring 408 coupled to the arm 433 rotate in the direction of arrow 432 (FIG. 4B). During this rotations, bypass slots 410 of the choke ring 408 are gradually blocked (covered) by the cover ring 404 and the ground ring 414 until the slots 410 are entirely blocked in the position depicted in FIG. 4B.

As the actuation rod 422 is moved upward, the lever 430 rotates to turn the choke ring 408 in the direction of arrow 436 (FIG. 4C). When the actuation rod 422 reaches its upper limit of movement, the slots 406, 410 and 412 are aligned with each other and the mechanism 420 provides the maximum gas flow conductance, through the slots 406, 410 and 412, as depicted in FIG. 4C.

Figure 5A:
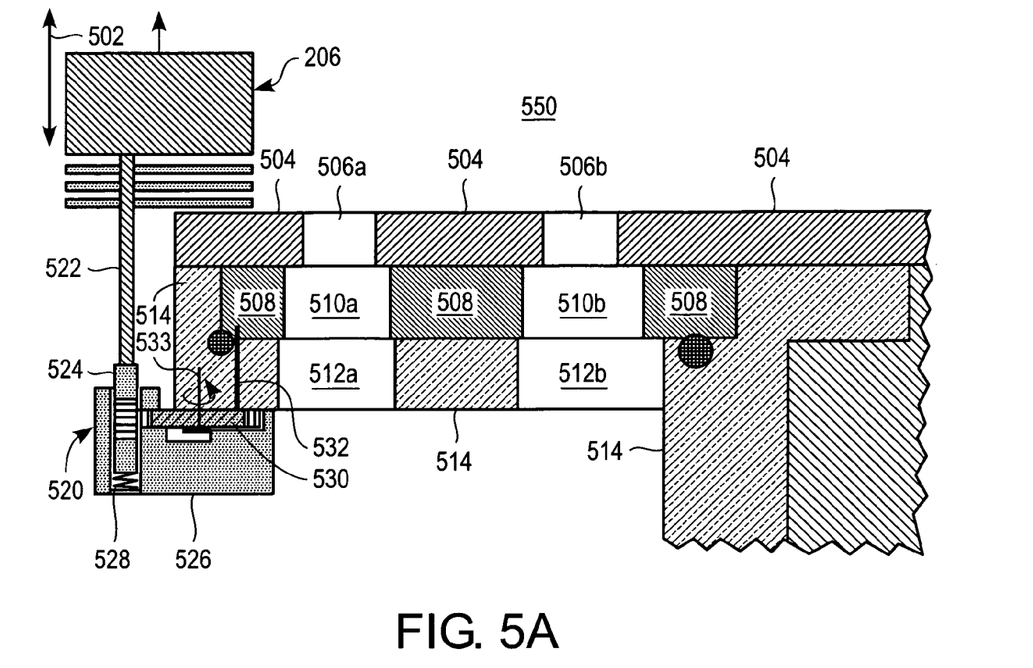
FIGS. 5A-5C show another alternative embodiment of an apparatus for controlling gas flow conductance.

FIG. 5A shows an apparatus including a choke ring control mechanism 520 according to another exemplary embodiment. In the illustrated embodiment, the lower electrode assembly has a structure similar to that of the embodiment shown in FIG. 3A. As depicted in FIG. 5A, the confinement ring assembly 206 is moved in the direction of arrow 502, which is preferably in the axial direction of the ground ring 514, by a suitable mechanism. The mechanism 520 is operable to control the choke ring 508. The mechanism 520 includes an actuation rod 522 coupled to the confinement ring assembly 206; a first actuation component 524 resiliently urged against the actuation rod 522 by a spring 528; a second actuation component 530 coupled to the first actuation component 524 and configured to rotate on an axis 533 when the first actuation component 524 moves in the direction 502; and an arm 532 secured to the second actuation component 530. The axis 533 may be oriented substantially parallel to the axial direction of the ground ring 514. The mechanism 520 also includes a support element 526 secured to the ground ring 514 and which provides mechanical support for the first actuation component 524 and spring 528. The first and second actuation components 524, 530 form a mechanism to convert linear motion into rotational motion. For instance, the first and second actuation components 524, 530 can be a mating pair of gears, as depicted.

Figure 5B:
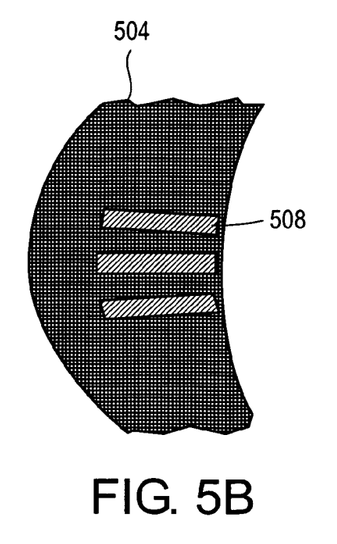
Figure 5C:
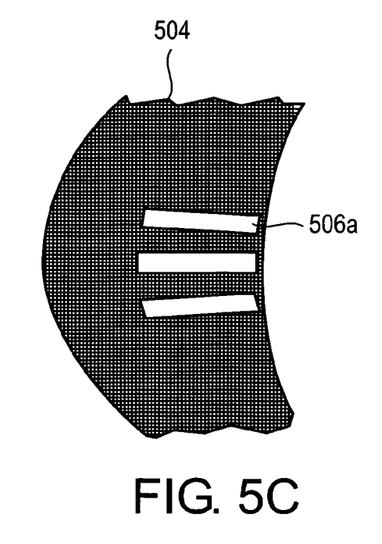

As the confinement ring assembly 206 is moved in the direction 502, the arm 532 and bypass choke ring 508 (with slots 510a, 510b) coupled to the arm 532 rotate relative to the stationary ground ring 514 (with slots 512a, 512b) and slotted ground cover ring 504 (with slots 506a, 506b). FIG. 5B shows a top view of the cover ring 504 with slots 506a blocked by the choke ring 508. This slot configuration is the OFF gas flow state. FIG. 5C shows a top view of the cover ring 504 with slots 506a aligned with the other slots 510a and 512a to form gas flow passageways therethrough. This slot configuration is a fully ON gas flow state. The mechanism 520 is operable to control the choke ring 508 and provide a variable gas flow conductance between the OFF state and the depicted fully ON state, i.e., a state in which the slots 512 in the ground ring are partially overlapped by the choke ring 508. In other words, the ON state can range from fully ON to partially on.

The exemplary embodiments of the mechanisms for controlling gas flow conductance shown in FIGS. 2-5C are actuated by CAM rings (not shown in the figures for brevity). The CAM rings can be controlled, for example, by a suitable control mechanism that is responsive to a pressure sensor signal from a pressure sensor operable to measure the chamber pressure. The pressure sensor, CAM control mechanism, and each of the choke ring control mechanisms shown in FIGS. 2-5C can form a feedback control system for accurate control of the plasma pressure in the gap 550 between the lower and upper electrode assemblies (FIG. 5A).

Figure 6A:
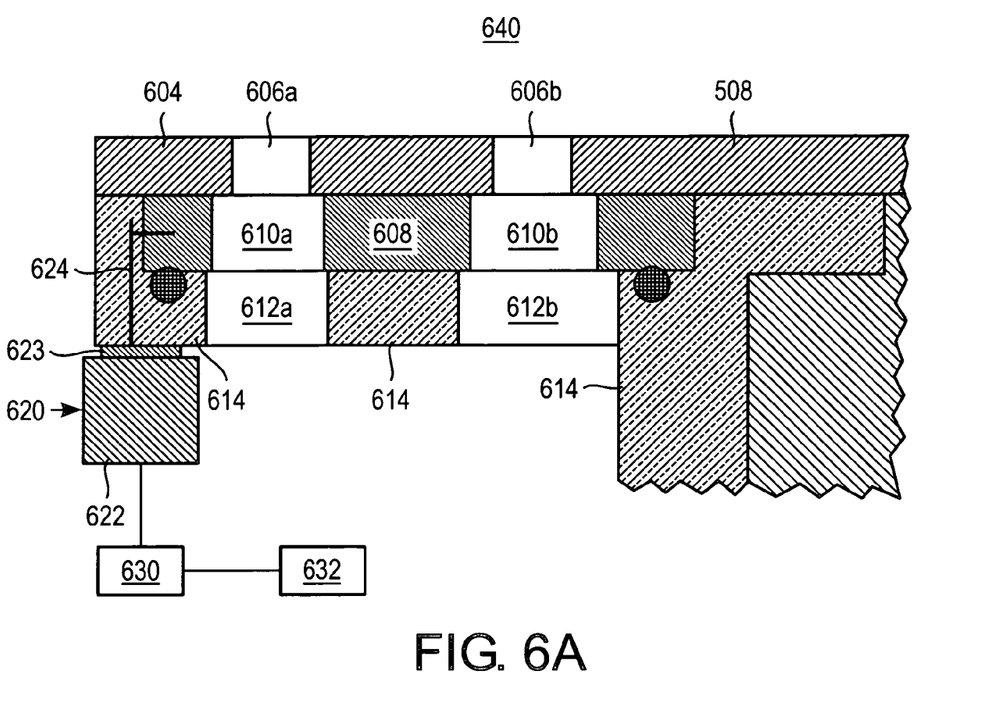
FIGS. 6A-6C show an apparatus for controlling gas flow conductance in accordance with another embodiment.

FIG. 6A shows an apparatus including a choke ring control mechanism 620 in accordance with another exemplary embodiment. As depicted, the lower electrode assembly has a structure similar to that of the embodiment shown in FIG. 3A. A confinement ring assembly can optionally be used in conjunction with the mechanism 620. The mechanism 620 controls the choke ring 608 to control gas flow conductance. The mechanism includes a motor 622 having a rotor 623 and an L-shaped arm 624 that is coupled to the rotor 623 and choke ring 608. As the motor 622 rotates the rotor 623 and arm 624, the choke ring 608 (with slots 610a, 610b) is rotated relative to a stationary ground ring 614 (with slots 612a, 612b) and slotted ground cover ring 604 (with slots 606a, 606b). The motor 622 can be a high-precision stepping motor and have a small dimension so that it can be located near to, or secured to, the ground ring 614.

The motor 622 is controlled by a motor control device or motor controller 630. The motor control device 630 is responsive to, inter alia, a pressure sensor signal from a pressure sensor 632 for measuring the chamber pressure. The pressure sensor 632, motor control device 630, and choke ring control mechanism 620 can form a feedback system for accurate control of the plasma pressure in the gap 640.

Figure 6B:
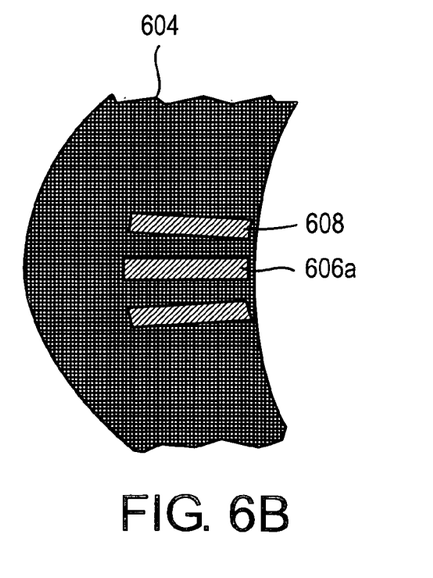
Figure 6C:
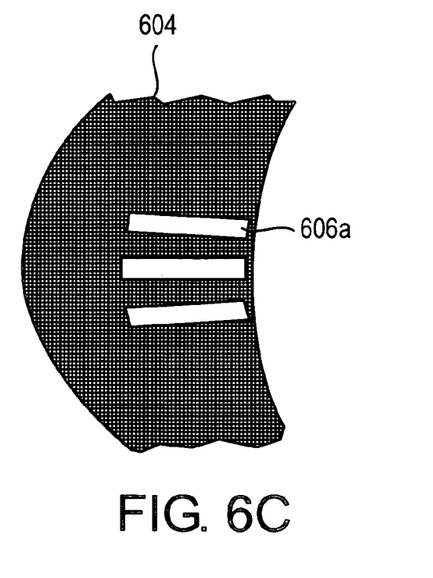

FIG. 6B shows a top view of the cover ring 604 with slots 606a blocked by the choke ring 608 in the OFF state. FIG. 6C shows a top view of the cover ring 604 with slots 606a aligned with the other slots 610 and 612 to form gas flow passageways in a fully ON state. However, the mechanism 620 is operable to provide a variable gas flow conductance through the slots between the two states shown, i.e., a state in which the slots 612 in the ground ring 614 are partially overlapped by the choke ring 604. In other words, the ON state can range from fully ON to partially on.

Figure 7:
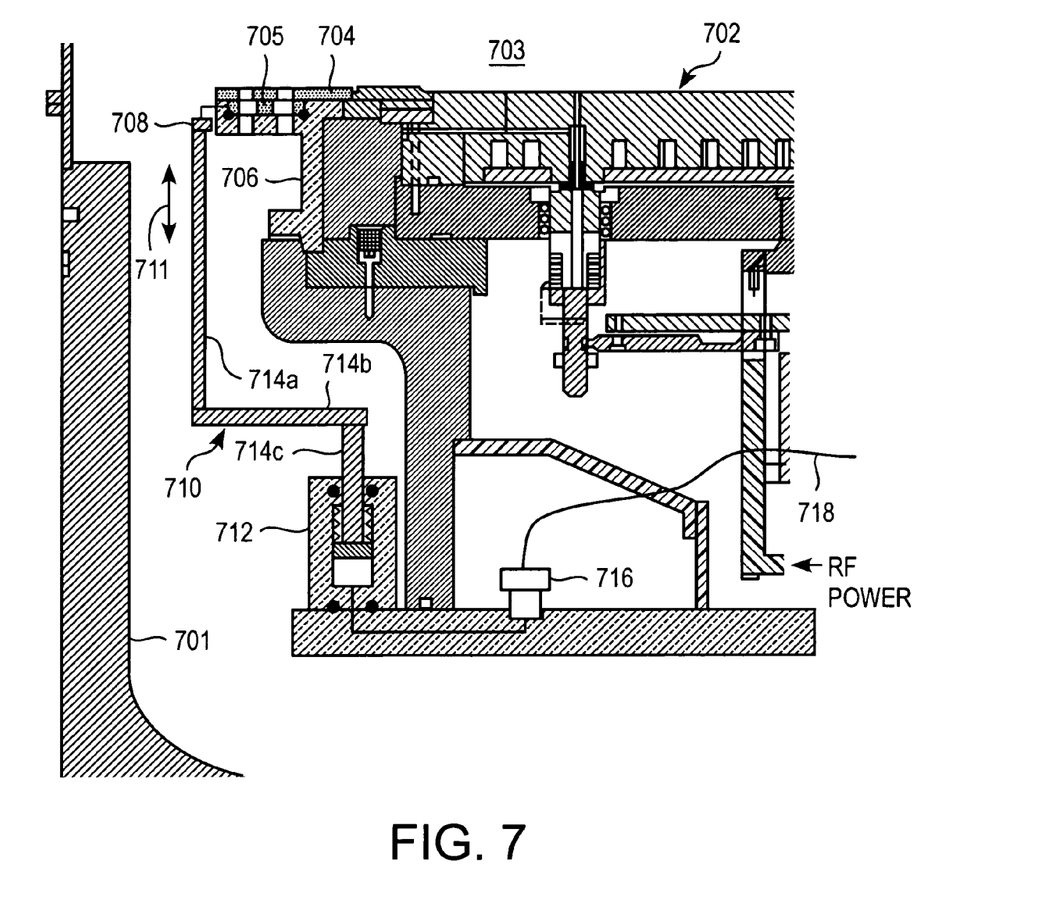
FIG. 7 shows an apparatus for controlling gas flow conductance in accordance with another embodiment.

FIG. 7 shows an apparatus including a choke ring control mechanism 710 in accordance with another exemplary embodiment. In the embodiment, the lower electrode assembly 702 is similar to that of the embodiment shown in FIG. 3A. In this embodiment, the lower electrode assembly and an upper electrode assembly, which is not shown for simplicity, define a gap 703 where the process gas is excited into the plasma state by RF power supplied to the lower electrode assembly 702. A confinement ring assembly can optionally be used in conjunction with the mechanism 710. The cover ring 704 and ground ring 706 are stationary. The choke ring 705 is rotated relative to the cover ring 704 and ground ring 706 to control the gas flow conductance through the slots in the rings 704, 706.

As depicted, the mechanism 710 includes: an arm unit 714a, 714b, 714c (referred to herein collectively as arm unit 714); a pneumatic cylinder 712 for actuating the arm unit 714 in the direction of arrow 711; and a motion converting mechanism 708. In another embodiment, the components of the arm unit 714 can be formed as an integral body. The motion converting mechanism 708 is coupled to the arm unit 714 and the choke ring 705 and is operative to convert linear motion of the arm unit 714 into rotational motion of the choke ring 705. In the embodiment, the mechanism 708 can be similar to the mechanisms 320, 420, and 520. For example, the component 714a can be used in place of the actuation rods 324, 422, and 522, while the other components of the mechanism 320, 420, and 520 can be oriented to accommodate the component 714c extending from the bottom side.

In another embodiment, an electrical solenoid can be controlled by an arm control device 716. The arm control device 716 can receive a control signal through an electrical cable 718. The cable 718 can also include a pressure sensor signal from a pressure sensor for measuring the chamber pressure. The choke ring control mechanism 710, pressure sensor, and the arm control device 716 can form a feedback control system for accurate control of the plasma pressure in the gap 703.

Figure 8:
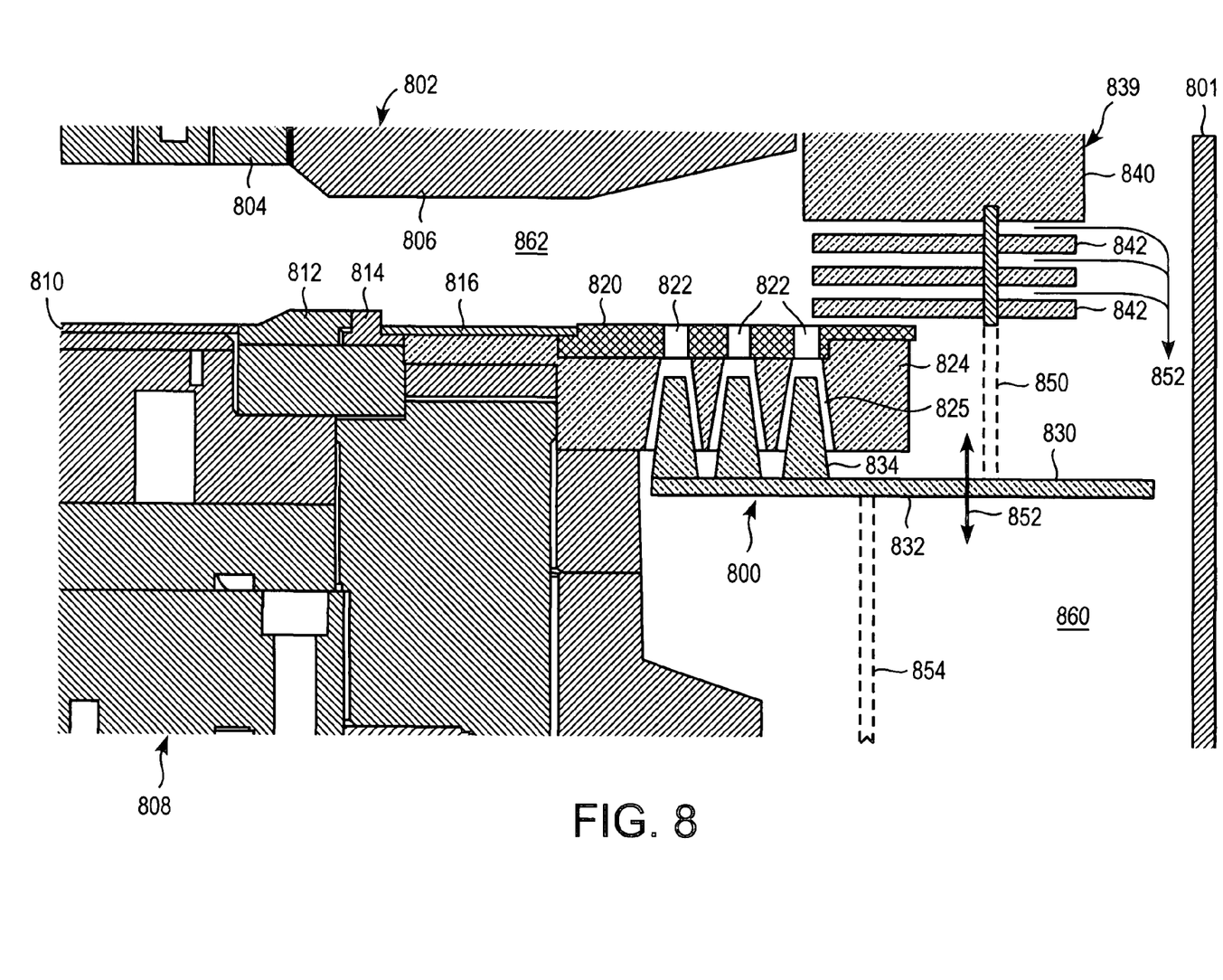
FIG. 8 shows an apparatus for controlling gas flow conductance in accordance with another embodiment.

FIG. 8 shows an apparatus 800 for controlling gas flow conductance in accordance with another embodiment. As depicted, the upper electrode assembly includes an upper electrode 804 having a showerhead configuration for distributing process gas into a gap 862; and an upper ground ring 806 surrounding the upper electrode 804. The lower electrode assembly 808 includes an electrostatic chuck 810 for holding a substrate in place during plasma processing; upper hot edge ring 812, which can be formed of silicon; dielectric outer ring 814, which can be formed of quartz; and an inner cover ring 816 for protecting the ground ring 824 from the plasma in the gap 862. For simplicity, the other components of the upper and lower electrode assemblies 802, 808 are not shown in FIG. 8. However, other types of upper and lower electrode assemblies can be practiced with this embodiment insofar as the mechanism 800 can be operated in conjunction with the assemblies.

The plasma in the gap 862 is confined by a confinement ring assembly 839 that includes a WAP ring 840 and a plurality of confinement rings 842. Neutral species in the gap 862 pass through the gaps between the rings 840, 842 and flow in the direction of arrow 852.

The illustrated apparatus 800 provides an additional gas flow conductance path and includes a slotted ground cover ring 820 with multiple slots 822; ground ring 824 with multiple slots 825 aligned with the slots 822; and a bypass choke ring 830 having multiple protrusions 834 formed thereon. The choke ring 830 is movable in the direction of arrow 852 by a suitable actuation mechanism, so that the spacing between the protrusions 834 and the inner surfaces of the slots 822 and 825 (i.e., flow path) can be controlled, to thereby control the gas flow rate through the slots 822. For example, in one embodiment, one or more actuation rods or bars 850 coupled to the confinement ring assembly 839 actuate the choke ring 830. In another embodiment, an arm unit 854 similar to the component 714C in the embodiment shown in FIG. 7 is coupled to the choke ring 830 and is operative to actuate the choke ring 830. The slots 822 in ground cover ring 820 are similar to slots 310 in the embodiment shown in FIG. 3E. Alternatively, the slots 822 can be in the form of concentric rings and the protrusions can also be concentric rings when viewed from the top.

In general, the volume of the gap region, such as 862, between the upper and lower electrode assemblies is relatively small compared to that of the chamber space, such as 860. As the etch rate of the substrate is directly affected by plasma in the gap, the confinement ring assembly enables a small volume pressure control and plasma confinement over the entire range of the gap without major physical change to the chamber hardware. Also, as the volume of the gap is small and the gas flow conductance is increased by the bypass slots shown in FIGS. 3A-8, plasma conditions can be controlled quickly and accurately in plasma processing chambers.

While the invention has been described in detail with reference to specific embodiments thereof, it will be apparent to those skilled in the art that various changes and modifications can be made, and equivalents employed, without departing from the scope of the appended claims.

What is claimed is:

1. An apparatus for controlling gas flow conductance in a plasma processing chamber including an upper electrode disposed opposite a lower electrode adapted to support a substrate, the apparatus comprising:

a stationary ground ring configured to concentrically surround the lower electrode, the ground ring including a first set of slots formed therein;

a stationary cover ring including a second set of slots formed therein;

a bypass choke ring disposed between the ground ring and the cover ring, the bypass choke ring including a third set of slots formed therein; and a mechanism adapted to rotate the bypass choke ring relative to the ground ring to vary an amount of overlap between the first and third sets of slots to thereby control gas flow conductance through the first, second, and third sets of slots between (i) an ON state in which the first set of slots is in fluid communication with the third set of slots such that gas can flow through the first, second and third sets of slots and (ii) an OFF state in which the first set of slots is blocked by the bypass choke ring such that gas cannot flow through the first, second and third sets of slots, the mechanism comprising an actuation rod and an actuation system coupled to the actuation rod and operative to move the actuation rod in an axial direction of the ground ring and, wherein: (a) the actuation system is a pneumatic cylinder or an electrical solenoid; (b) the actuation rod comprises a first end and a second end coupled to the actuation system and the mechanism further comprises a shaft rotatably secured to the ground ring and having a rotational axis substantially perpendicular to the axial direction of the ground ring, an elongated arm having one end secured to one end of the shaft and the other end coupled to the bypass choke ring, a lever having first and second ends and secured to the shaft intermediate the first and second ends thereof, a counterweight attached to the first end of the lever, and an actuation component attached to the second end of the lever and urged against the first end of the actuation rod by the counterweight, wherein the actuation rod, when moved by the actuation system in the axial direction of the ground ring, rocks the lever along the rotational axis of the shaft, causing the shaft and the elongated arm to rotate along the rotational axis of the shaft, thereby causing the bypass choke ring to rotate relative to the ground ring; (c) the actuation rod comprises a first end coupled to the actuation system and a tapered end portion opposite to the first end and the mechanism further comprises a lever comprising first and second end portions and pivoted to the ground ring intermediate the first and second end portions about an axis substantially parallel to the axial direction of the ground ring, the second end portion of the lever being in sliding contact with the tapered end portion of the actuation rod, an elongated arm having one end secured to the first end portion of the lever and the other end coupled to the bypass choke ring, and a first spring having two ends respectively secured to the ground ring and the lever and operative to resiliently urge the second end portion of the lever against the tapered end portion of the actuation rod, wherein the tapered end portion of the actuation rod, when moved by the actuation mechanism in the axial direction of the ground ring, rocks the lever causing the elongated arm to rotate, thereby causing the bypass choke ring to rotate relative to the ground ring; or (d) the mechanism further comprises an outer case secured to the ground ring and having walls that partially surround the tapered end portion of the actuation rod and a second spring interposed between one of the walls and a tip of the actuation rod and operative to urge the actuation rod toward the actuation system.

2. An apparatus for controlling gas flow conductance in a plasma processing chamber including an upper electrode disposed opposite a lower electrode adapted to support a substrate, the apparatus comprising:
   a stationary ground ring configured to concentrically surround the lower electrode, the ground ring including a first set of slots formed therein;
   a stationary cover ring including a second set of slots formed therein;
   a bypass choke ring disposed between the ground ring and the cover ring, the bypass choke ring including a third set of slots formed therein; and
   a mechanism adapted to rotate the bypass choke ring relative to the ground ring to vary an amount of overlap between the first and third sets of slots to thereby control gas flow conductance through the first, second, and third sets of slots between (i) an ON state in which the first set of slots is in fluid communication with the third set of slots such that gas can flow through the first, second and third sets of slots and (ii) an OFF state in which the first set of slots is blocked by the bypass choke ring such that gas cannot flow through the first, second and third sets of slots the mechanism comprising an actuation rod and an actuation system coupled to the actuation rod and operative to move the actuation rod in an axial direction of the ground ring and, wherein:
   the actuation rod comprises a first end and a second end coupled to the actuation system; and
   the mechanism further comprises:
      a first actuation component in contact with the first end of the actuation rod and movable in the axial direction of the ground ring;
      a second actuation component coupled to the first actuation component and pivoted to the ground ring about an axis substantially parallel to the axial direction of the ground ring;
      an elongated arm secured at one end to the second actuation component and coupled at the other end to the bypass choke ring;
      a spring for resiliently urging the first actuation component toward the actuation rod and thereby urging the first actuation component against the first end of the actuation rod; and
      a support element secured to the ground ring and operative to provide mechanical support for the spring and the first actuation component,
   wherein the actuation rod, when moved by the actuation system in the axial direction of the ground ring, moves the first actuation component in the axial direction of the ground ring, causing the second actuation component and the elongated arm to rotate, thereby causing the bypass choke ring to rotate relative to the ground ring.

3. An apparatus for controlling gas flow conductance in a plasma processing chamber including an upper electrode disposed opposite a lower electrode adapted to support a substrate, the apparatus comprising:
   a stationary ground ring configured to concentrically surround the lower electrode, the ground ring including a first set of slots formed therein;
   a stationary cover ring including a second set of slots formed therein;
   a bypass choke ring disposed between the ground ring and the cover ring, the bypass choke ring including a third set of slots formed therein; and
   a mechanism adapted to rotate the bypass choke ring relative to the ground ring to vary an amount of overlap between the first and third sets of slots to thereby control gas flow conductance through the first, second, and third sets of slots between (i) an ON state in which the first set of slots is in fluid communication with the third set of slots such that gas can flow through the first, second and third sets of slots and (ii) an OFF state in which the first set of slots is blocked by the bypass choke ring such that gas cannot flow through the first, second and third sets of slots,
   wherein the mechanism comprises: a motor having a rotor; and
   an L-shaped arm secured to the rotor at one end and coupled to the bypass choke ring at the other end,
   wherein, when the motor rotates the rotor, the L-shaped arm rotates causing the bypass choke ring to rotate relative to the ground ring;
   further comprising a confinement ring assembly adapted to encircle a gap defined between the upper electrode and lower electrode and includes at least one confinement ring, wherein the confinement ring assembly is movable in the axial direction of the ground ring to control gas flow through gaps between the confinement rings.

4. The apparatus of claim 3, wherein: (a) the ground ring and the cover ring are stationary and the first set of slots is aligned with the second set of slots and/or (b) each of the cover ring and bypass choke ring is formed of dielectric material, and the ground ring is formed of conducting material.

5. The apparatus of claim 4, wherein the cover ring and the bypass choke ring are formed of quartz or SiC, and the ground ring is formed of metal.

6. The apparatus of claim 3, further comprising:
a pressure sensor for measuring gas pressure in the plasma processing chamber and sending a sensor signal; and
a control device responsive to the sensor signal and operative to send a control signal for controlling the mechanism.

7. A method of controlling flow conductance, comprising:
supporting a semiconductor substrate in the plasma processing chamber comprising the apparatus according to claim 3;
providing process gas into the gap between the upper and lower electrodes;
exciting the process gas into plasma; and
operating the mechanism to control a gas flow rate through the first set of slots.

8. The apparatus of claim 3, further comprising:
a pressure sensor for measuring gas pressure in the plasma processing chamber and sending a sensor signal; and
a motor controller responsive to the sensor signal and operative to send a control signal for controlling the motor.

9. The apparatus of claim 3, wherein: (a) each of the first, second, and third sets of slots includes at least one slot arranged along the peripheral direction of the ground ring or (b) each of the first, second and third sets of slots extends in a radial direction of the ground ring and has an elongated rectangular or trapezoidal shape.

10. The apparatus of claim 3, further comprising at least one ball interposed between the bypass choke ring and the ground ring, the ball being operative to reduce rotational friction therebetween when the bypass choke ring is moved relative to the ground ring and cover ring by the mechanism.

11. The apparatus of claim 3, wherein the bypass choke ring includes protrusions formed thereon.

12. The apparatus of claim 11, wherein a spacing between the protrusions and an inner surface of the first or second slots determines the gas flow conductance through the first and second sets of slots.

* * * * *